United States Patent [19]

Park

[11] Patent Number: 5,472,895
[45] Date of Patent: Dec. 5, 1995

[54] METHOD FOR MANUFACTURING A TRANSISTOR OF A SEMICONDUCTOR DEVICE

[75] Inventor: Sang H. Park, Kyungki-Do, Rep. of Korea

[73] Assignee: Hyundai Electronics Industries Co., Ltd., Kyungki-Do, Rep. of Korea

[21] Appl. No.: 364,046

[22] Filed: Dec. 27, 1994

[30] Foreign Application Priority Data

Dec. 27, 1993 [KR] Rep. of Korea ...................... 93-29813
Dec. 28, 1993 [KR] Rep. of Korea ...................... 93-30104

[51] Int. Cl.⁶ ...................... H01L 21/335; H01L 21/311
[52] U.S. Cl. .................. 437/44; 437/35; 437/192; 437/193; 437/228; 156/653.1
[58] Field of Search ...................... 437/44, 45, 41, 437/981, 35, 192, 193, 228; 156/653.1, 657.1, 659.11; 257/344, 366

[56] References Cited

U.S. PATENT DOCUMENTS

| | | | |
|---|---|---|---|
| 4,198,250 | 4/1980 | Jecmen | 437/44 |
| 4,818,715 | 4/1989 | Chao | 437/44 |
| 5,292,675 | 3/1994 | Codama | 437/44 |
| 5,314,832 | 5/1994 | Deleonibus | 437/27 |
| 5,320,974 | 6/1994 | Hori et al. | 437/44 |
| 5,330,925 | 7/1994 | Lee et al. | 437/44 |

OTHER PUBLICATIONS

Jambotkar, C., "Process for Fabricating an LDD FET" IBM Tech. Disc. Bull., vol. 27, No. 7B, Dec. 1984, pp. 4164–4165.

*Primary Examiner*—T. N. Quach
*Attorney, Agent, or Firm*—Fish & Richardson

[57] ABSTRACT

A method for manufacturing a transistor of a semiconductor device having a gate electrode smaller than the critical dimensions of a mask for a gate electrode by etching a polysilicon film for a gate electrode using an isotropic etching process and an anisotropic etching process utilizing a mask layer by forming the mask layer on the top of the polysilicon film for a gate electrode. This allows forming a gate electrode smaller than the critical dimensions by utilizing the prior art exposing apparatus; therefore, production costs for manufacturing the semiconductor can be reduced, and additionally, the manufacture of a highly integrated semiconductor device can be simplified by forming a gate electrode smaller than the critical dimensions.

15 Claims, 6 Drawing Sheets

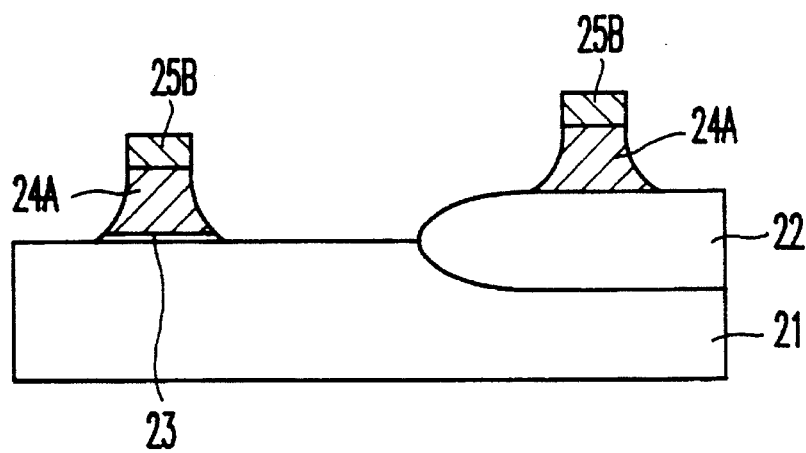
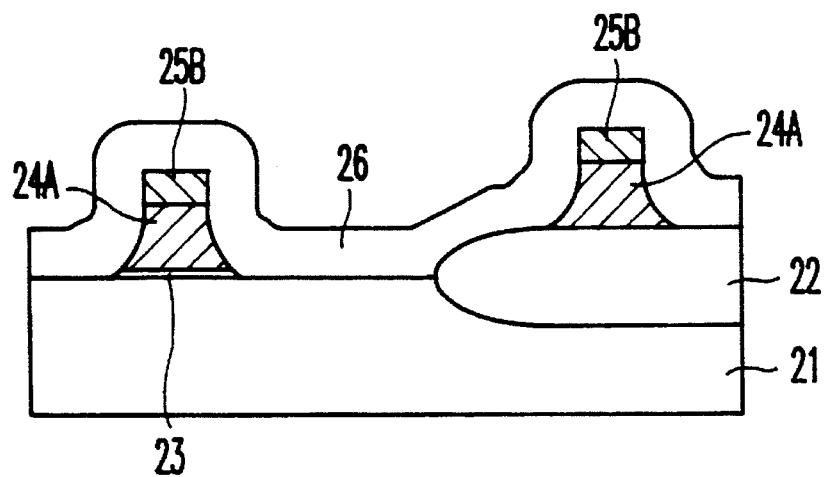
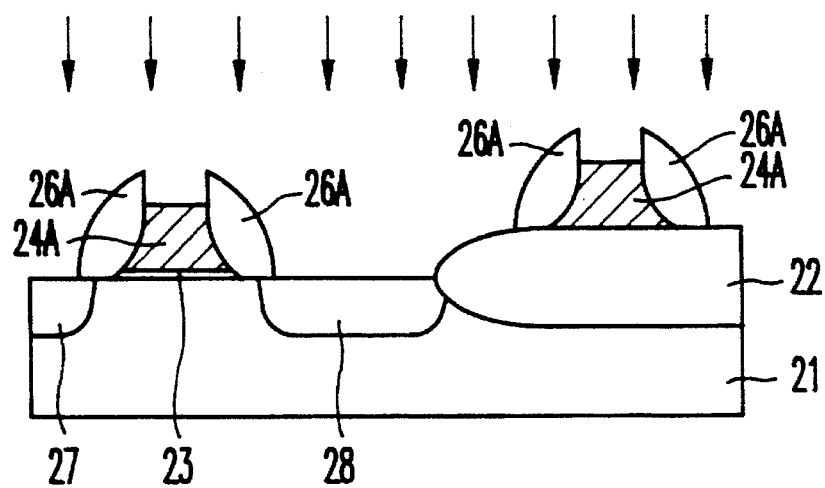

METHOD FOR MANUFACTURING A TRANSISTOR OF A SEMICONDUCTOR DEVICE

FIELD OF THE INVENTION

The present invention relates to a method for manufacturing a transistor of a semiconductor device, and particularly to a method for manufacturing a transistor of a semiconductor device having a gate electrode smaller than the critical dimensions of a mask for a gate electrode.

BACKGROUND OF THE INVENTION

A section of a device is shown in FIG. 1 to illustrate a general method for forming a gate electrode.

A polysilicon film 4 for a gate electrode is formed on a silicon substrate 1 formed with a field oxide film 2 and a gate oxide film 3. A photoresist pattern 9 is formed on the top of the polysilicon film 4 by means of a lithography process utilizing a gate electrode mask. The gate electrode is formed by a polysilicon etching process using the photoresist pattern 9 as an etching mask. However, as the semiconductor device is highly integrated, the gate electrode becomes small in its pattern line width. The pattern line width of the gate electrode is determined by the photoresist pattern. In order to form a pattern line width of the gate electrode equal to or smaller than that of the critical dimensions therefor, a highly developed lithography process is required and an expensive exposing apparatus is necessary to form the photoresist pattern used as the etching mask.

SUMMARY OF THE INVENTION

Therefore, an object of the present invention is to provide a method for manufacturing a transistor of a semiconductor device having a gate electrode smaller than the critical dimensions of a mask for a gate electrode.

The transistor manufacturing process for achieving the object of the present invention is comprised of the following steps of:

forming a mask layer on the top of a polysilicon film for a gate electrode, and then forming a mask pattern by a lithography process and the mask layer etching process;

forming a polysilicon pattern having an inclined side by etching the polysilicon film by means of an etching process utilizing the mask pattern as a barrier to etching until a silicon substrate is exposed;

etching the mask pattern to be the same size as the polysilicon pattern by an etching process, and then implanting highly concentrated impurities into the exposed silicon substrate to form a source and drain regions;

depositing an oxide film on the top of the entire structure, and then forming an oxide spacer by etching the oxide film by means of an etching process;

removing the mask pattern by means of an etching process, and then forming a transition metal film on the exposed polysilicon pattern and the silicon substrate surface portion; and removing the oxide spacer by means of an etching process, and then forming a gate electrode by etching the exposed side of the polysilicon pattern by means of an etching process utilizing the transition metal film as the etching barrier layer, and thereafter implanting low concentrated impurities into the source and drain regions.

In addition, the transistor manufacturing process achieves the object of the present invention which is comprised of the following steps:

forming a mask layer on the top of a polysilicon film for a gate electrode, and then forming a mask pattern by a lithography process and said mask layer etching process;

forming a polysilicon pattern having an inclined side by etching the polysilicon film by means of an etching process utilizing the mask pattern as an etching barrier layer until a silicon substrate is exposed;

etching the mask layer pattern to be the same size as the polysilicon film pattern by means of an etching process, and then depositing an oxide film on the top of the entire structure;

forming an oxide spacer by etching the deposited oxide film with an etching process, and then removing the mask layer pattern with the etching process;

implanting highly concentrated impurities into the exposed silicon substrate to form a source and drain regions, and then forming a transition metal film on the exposed polysilicon pattern and the silicon substrate surface portion;

removing the oxide spacer with the etching process, and then forming a gate electrode by etching the exposed side of the polysilicon pattern by means of an etching process utilizing the transition metal film as the etching barrier layer; and implanting low concentrated impurities into the source and drain regions, and then slantwise implanting the highly concentrated impurities of another type.

BRIEF DESCRIPTION OF THE DRAWING

To better understand the nature and objects of the invention, reference should be made to the following detailed description taken in conjunction with the accompanying drawings in which:

FIGS. 3A through 3H are section views of a device illustrating the steps of manufacturing a transistor of a semiconductor device according to another embodiment of the present invention.

Similar reference characters refer to similar parts throughout the several views of the drawings.

DETAILED DESCRIPTION OF THE INVENTION

FIGS. 2A through 2H are section views of a device to illustrate the steps of manufacturing a transistor of a semiconductor device according to an embodiment of the present invention.

Figure 1:
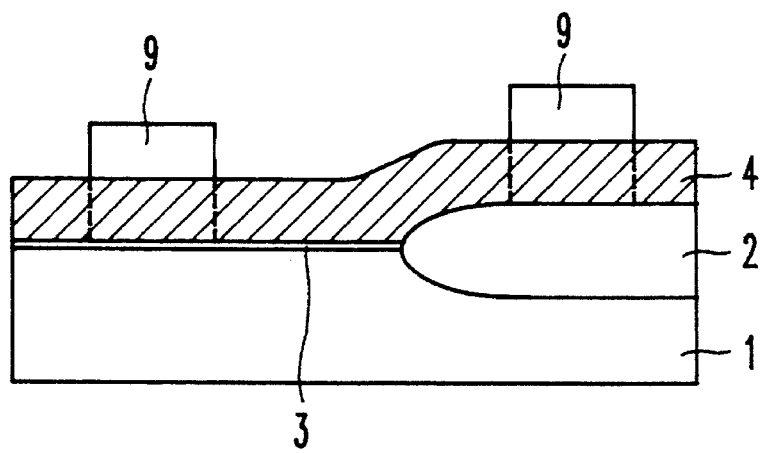
FIG. 1 is a section view of a device illustrating a general method for forming a gate electrode.
Figure 2A:
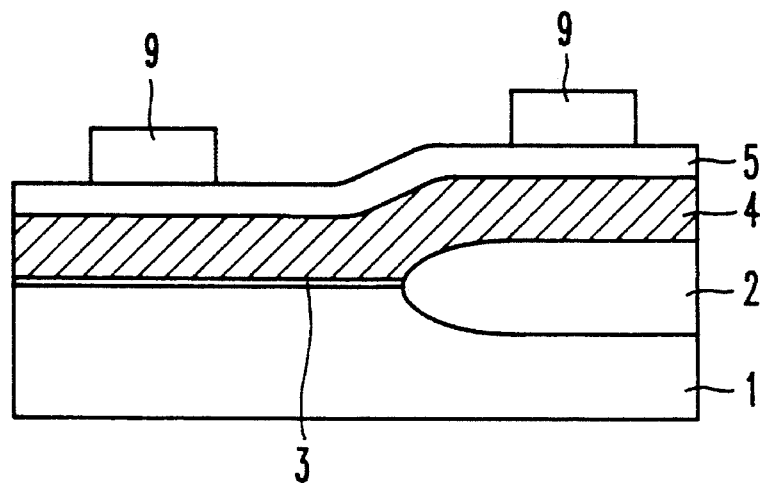
FIGS. 2A through 2H are section views of a device illustrating the steps of manufacturing a transistor of a semiconductor device according to an embodiment of the present invention.

Referring to FIG. 2A, a field oxide film 2 and a gate oxide film 3 are formed on a silicon substrate 1. A polysilicon film 4 for a gate electrode is formed on the top of the entire structure. A mask layer 5 is formed on the top of the polysilicon film 4. A photoresist pattern 9 is formed on the mask layer 5 by means of a lithography process.

The mask layer 5 is formed by depositing nitride and acts as barrier when the polysilicon film 4 is etched.

Figure 2B:
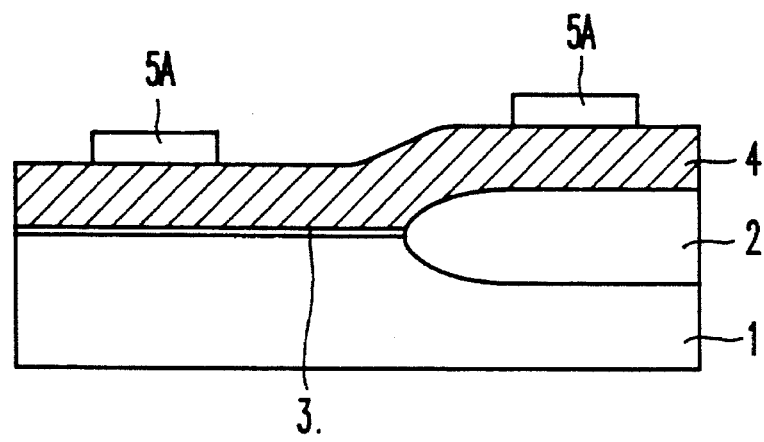

Referring to FIG. 2B, a first mask pattern 5A is formed by etching the mask layer 5 by means of the anisotropic etching process utilizing the photoresist pattern 9.

Figure 2C:
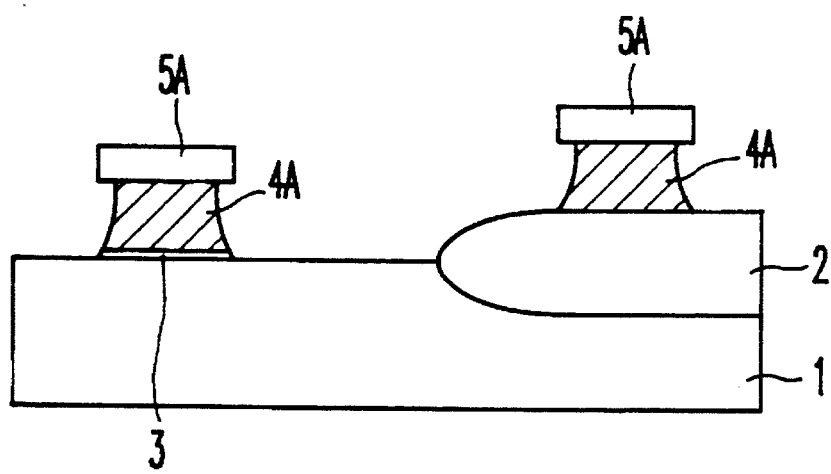

Referring to FIG. 2C, a polysilicon pattern 4A having an inclined side ms formed by etching the polysilicon film 4 by means of the isotropic etching process utilizing the first mask pattern 5A until the polysilicon substrate 1 is exposed.

To formed the polysilicon pattern 4A, the isotropic etching process is used in a mixed solution of HF and $HNO_3$.

Figure 2D:
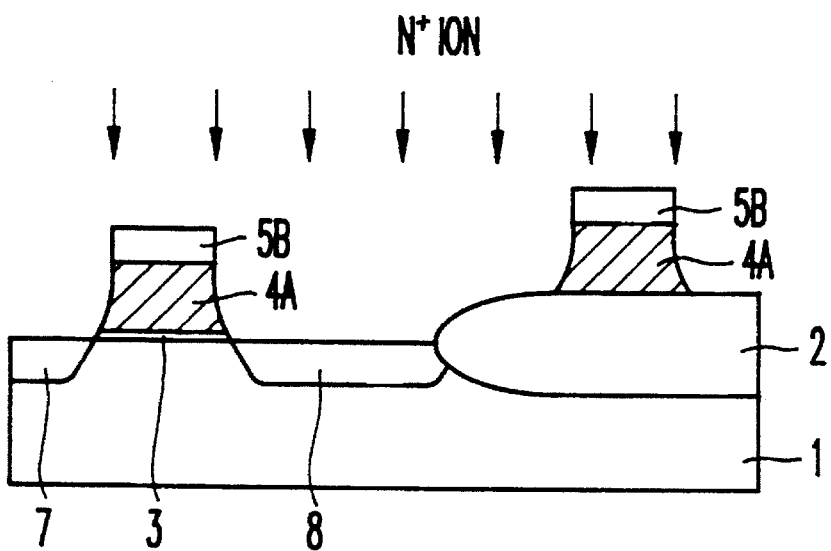

Referring to FIG. 2D, a second mask pattern 5B is formed which is reduced in its size by etching the first mask pattern 5A to be the same size as the polysilicon pattern 4A by means of the etching process, and thereafter highly concentrated impurities are implanted into the exposed silicon substrate 1 to form a source region 7 and a drain region 8.

Where the mask layer 5 is composed of nitride, the etching process is used to form the second mask pattern 5B, in $H_3PO_4$ at a the temperature range of between 160 to 180 degree Celsius.

Figure 2E:
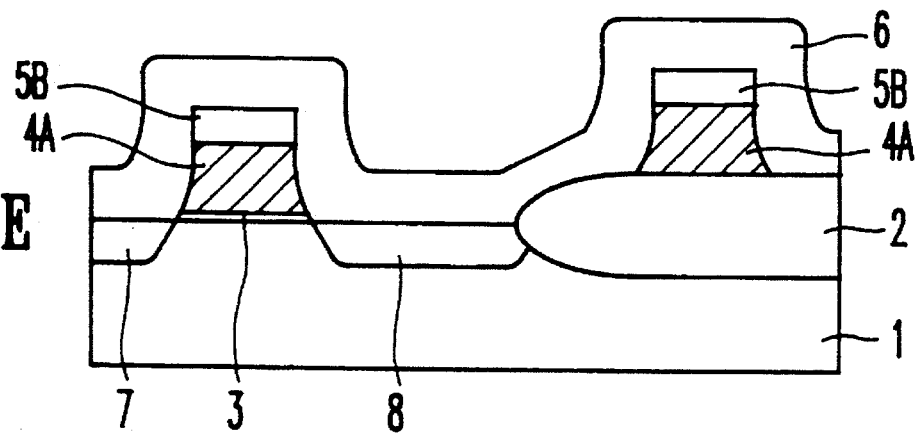

Referring to FIG. 2E, an oxide film 6 is deposited on the top of the entire structure.

The oxide film 6 is a low temperature oxide film, TEOS or $SiH_4$, deposited to a thickness of 2000–3000 Å at a low temperature of 450 degree Celsius.

Figure 2F:
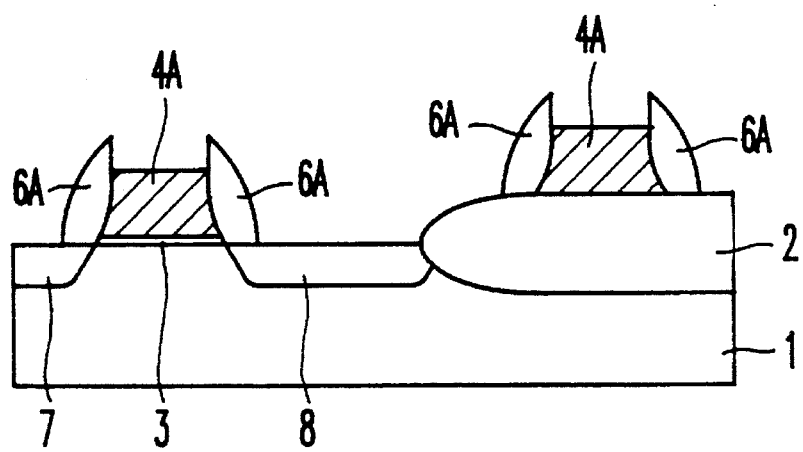

Referring to FIG. 2F, oxide spacers 6A are formed on both sides of the polysilicon pattern 4A by etching the oxide film 6 by means of the anisotropic etching process, such as Reactive Ion Etching(RIE), etc.; thereafter, the second mask pattern 5B is removed by the etching process.

Where the mask layer 5 is composed of nitride, the etching process is used to remove the second mask pattern 5B, in $H_3PO_4$ at a temperature range of between 160 to 180 degree Celsius.

Figure 2G:
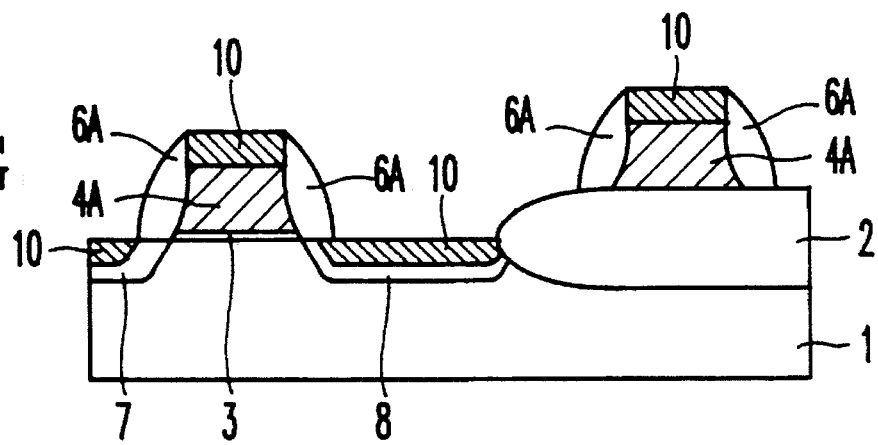

Referring to FIG. 2G, a transition metal film 10 is formed on the surface of the exposed polysilicon pattern 4A and the silicon substrate 1 by depositing the transition metal of W, Ti, Ta and Mo, etc. on the top of the entire structure; thereafter, any unreacting transition metal is removed by a mixed solution of sulfuric acid and hydrogen peroxide.

Figure 2H:
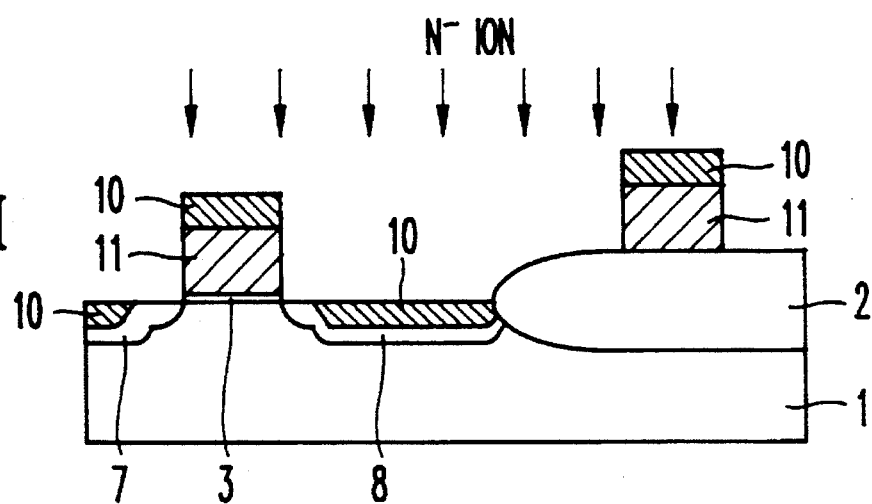

Referring to FIG. 2H, the oxide spacer 6A is removed by means of the etching process. A gate electrode 11 is formed by etching the exposed side of the polysilicon pattern 4A by means of the anisotropic etching process utilizing the transition metal film 10 as the etching barrier layer, and thereafter low concentrated impurities are implanted into the source region 7 and the drain region 8.

The etching process using HF or a mixed solution of HF and $NH_4F$ is applied to removed the oxide spacer 6A.

FIGS. 3A through 3H are section views of a device illustrating the steps of manufacturing a transistor of a semiconductor device according to another embodiment of the present invention.

Figure 3A:
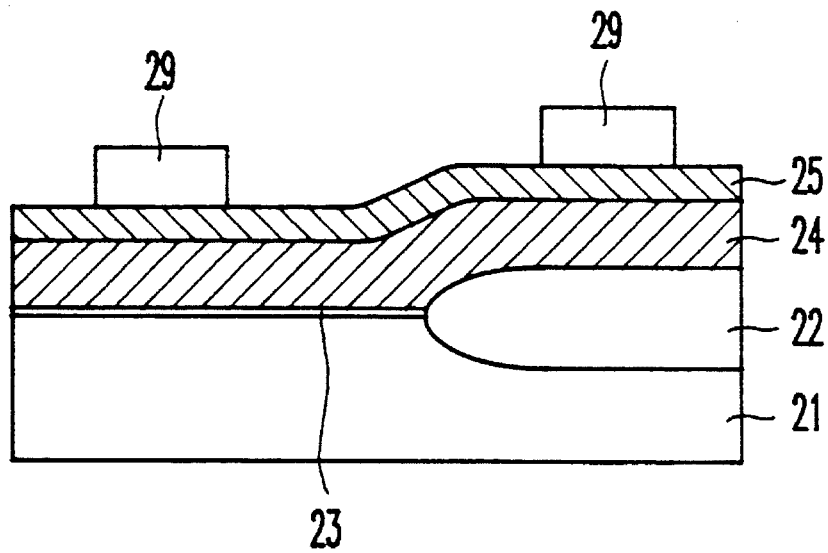

Referring to FIG. 3A, a field oxide film 22 and a gate oxide film 23 are formed on a silicon substrate 21. A polysilicon film 24 is deposited on the top of the entire structure for forming a gate electrode. A mask layer 25 is formed on the top of the polysilicon film 24. A photoresist pattern 29 is formed on the mask layer 25 by means of a lithography process.

The mask layer 25 is formed by depositing nitride and acts as barrier to the etching of the polysilicon film 24.

Figure 3B:
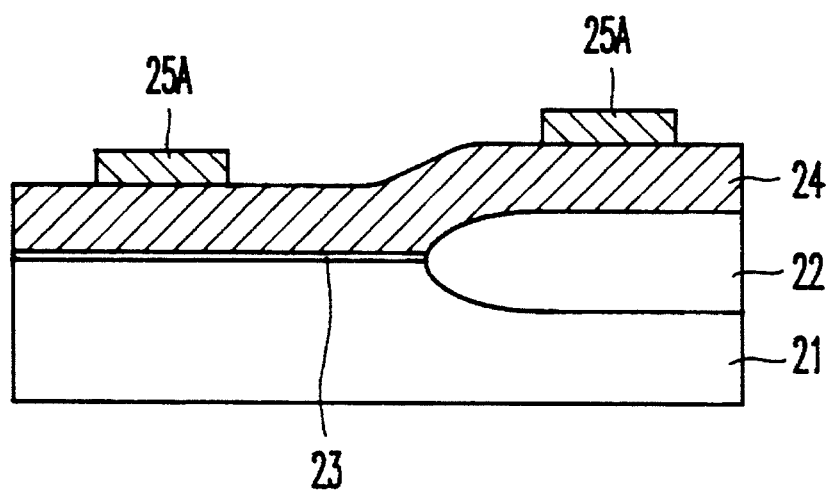

Referring to FIG. 3B, a first mask pattern 25A is formed by etching the mask layer 25 by means of the anisotropic etching process utilizing the photoresist pattern 29.

Figure 3C:
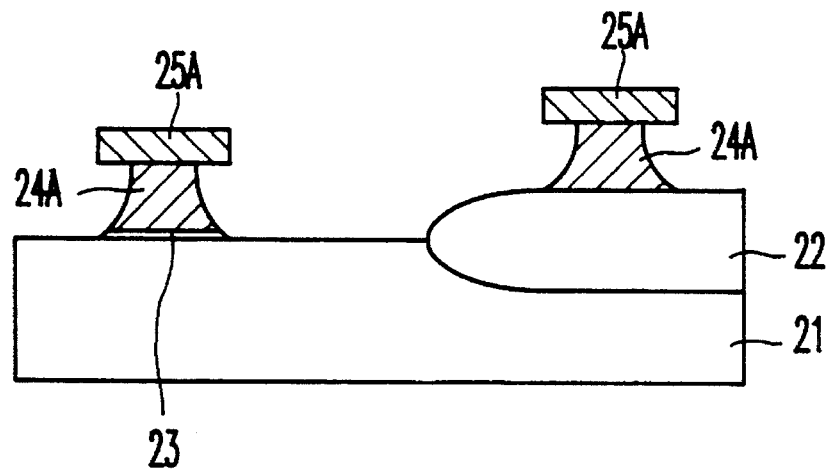

Referring to FIG. 3C, a polysilicon pattern 24A having an inclined side is formed by etching the polysilicon film 24 by means of with the isotropic etching process utilizing the first mask pattern 25A until the polysilicon substrate 21 is exposed.

The isotropic etching process is used in a mixed solution of HF and $HNO_3$ to form the polysilicon pattern 24A.

Referring to FIG. 3D. a second mask pattern 25B is formed which is reduced in its size by etching the first mask pattern 25A to the same size as the polysilicon pattern 4A by means of the etching process.

Where the mask layer 25 is composed of nitride, the etching process is used to form the second mask pattern 25B, in $H_3PO_4$ at a temperature range of 160 to 180 degree Celsius.

Referring to FIG. 3E, an oxide film 26 is deposited on the top of the entire structure.

The oxide film 26 is a low temperature oxide film, TEOS or $SiH_4$, deposited to a thickness of 2000–3000 Å at the low temperature of 450 degree Celsius.

Referring to FIG. 3F, oxide spacers 26A are formed on both sides of the polysilicon pattern 24A by etching the oxide film 26 by means of the anisotropic etching process, such as Reactive Ion Etching(RIE). Thereafter, the mask layer pattern 25B is removed by the etching process, and then highly concentrated impurities are implanted into the exposed silicon substrate 21 to form a source region 27 and a drain region 28.

Where the mask layer 25 is composed of nitride, the etching process is used to remove the second mask pattern 25B, in $H_3PO_4$ at a temperature range of 160 to 180 degree Celsius.

Figure 3G:
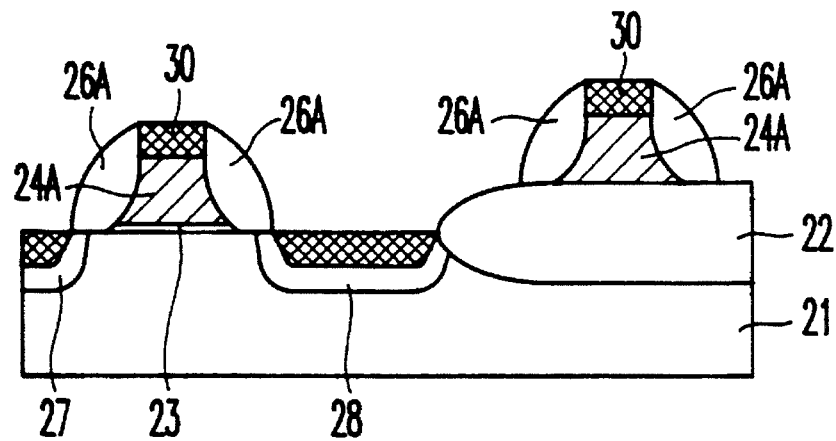

Referring to FIG. 3G, a transition metal film 30 is formed on the surface of the exposed polysilicon pattern 24A and the silicon substrate 21 by depositing the transition metal, W, Ti, Ta or Mo, etc., on the top of the entire structure. Thereafter, unreacting transition metal is removed by a solution of sulfuric acid and hydrogen peroxide.

Figure 3H:
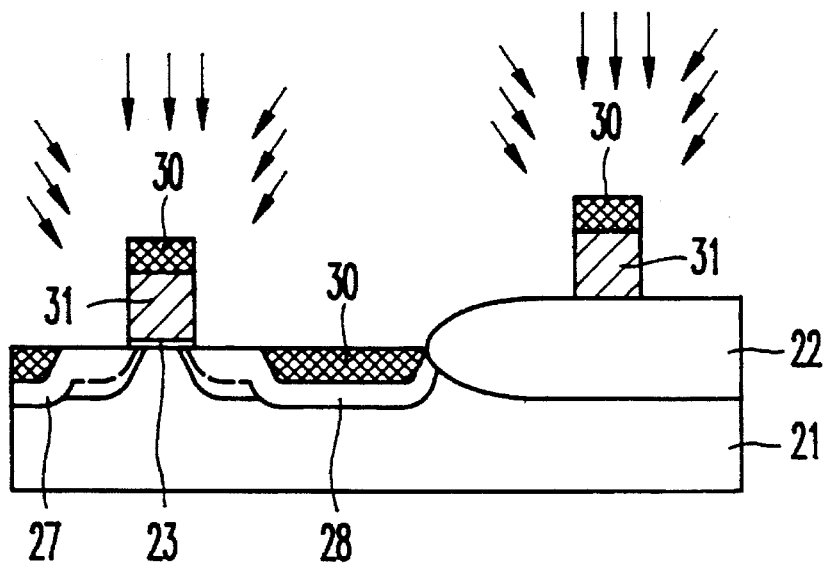

Referring to FIG. 3H, the oxide spacer 26A is removed by means of the etching process. A gate electrode 31 is formed by etching the exposed side of the polysilicon pattern 24A by means of the anisotropic etching process utilizing the transition metal film 30 as barrier to etching. Thereafter, low concentrated impurities are implanted into the source region 27 and the drain region 28, and thereafter slantwise implanting the high concentration impurities of another type.

The etching process is used to remove the oxide spacer 26A, in HF or a mixed solution of HF and $NH_4F$.

Where the impurities used for forming the source region 27 and the drain region 28 are N-type, the impurities which are slantwise implanted are P-type. The region into which the high concentration P-type impurities are implanted is formed below the low concentration impurity region.

The present invention as described above can form a gate electrode smaller than the critical dimensions by utilizing the prior art exposing apparatus, therefore the cost of the product in manufacturing the semiconductor can be reduced, and in addition, the manufacture of highly integrated semiconductor device can be simplified by forming a gate electrode smaller than the critical dimensions.

Although this invention has been described in its preferred embodiment with a certain degree of particularity, one skilled in the art would know that the preferred embodiment disclosed here is only an example and that the construction, combination and arrangement of its parts may be varied without departing from the spirit and the scope of the invention.

What is claimed is:

1. A method for manufacturing a transistor of a semiconductor device comprised of the following steps:

forming a mask layer on the top of a polysilicon film for a gate electrode, and then forming a mask pattern by means of a lithography process and said mask layer etching process;

forming a polysilicon pattern having an inclined side by etching the polysilicon film by means of an etching process utilizing said mask pattern as a barrier to etching until a silicon substrate is exposed;

etching the mask pattern to be the same size as said polysilicon pattern by means of an etching process, and then implanting highly concentrated impurities into the exposed silicon substrate to form source and drain regions;

depositing an oxide film on the top of the entire structure, and then forming an oxide spacer by etching said oxide film by means of an etching process;

removing said mask pattern by means of an etching process, and then forming a transition metal film on said exposed polysilicon pattern and said silicon substrate surface portion; and removing said oxide spacer by means of an etching process, and then forming a gate electrode by etching the exposed side of said polysilicon pattern by means of an etching process utilizing said transition metal film as a barrier to etching, and thereafter implanting low concentrated impurities into the source and drain regions.

2. The method for manufacturing a transistor of a semiconductor device of claim 1, wherein said mask layer is formed by depositing nitride.

3. The method for manufacturing a transistor of a semiconductor device of claim 1, wherein said etching process is used in a solution of HF and $HNO_3$ to form the polysilicon pattern.

4. The method for manufacturing a transistor of a semiconductor device of claim 1, wherein in the case where said mask layer is composed of nitride, $H_3PO_4$ at a temperature ranging between 160 to 180 degree Celsius is used in the etching process of said mask pattern to be the same size as said polysilicon pattern and in the etching process for removing said mask layer pattern.

5. The method for manufacturing a transistor of a semiconductor device of claim 1, wherein said oxide film, is a low temperature oxide film deposited to a thickness of 2000–3000 Å at low temperature.

6. The method for manufacturing a transistor of a semiconductor device of claim 1, wherein the etching process for forming said oxide spacers uses RIE.

7. The method for manufacturing a transistor of a semiconductor device of claim 1, wherein the etching process is used in HF or a mixed solution of HF and $NH_4F$ to remove the oxide spacer.

8. A method for manufacturing a transistor of a semiconductor device comprised of the following steps:

forming a mask layer on top of a polysilicon film for a gate electrode, and then forming a mask pattern by means of a lithography process and said mask layer etching process;

forming a polysilicon pattern having an inclined side by etching the polysilicon film by means of an etching process utilizing said mask pattern as a barrier to etching until a silicon substrate is exposed;

etching the mask layer pattern to be the same size as the polysilicon film pattern by means of the etching process, and then depositing an oxide film on the top of the entire structure;

forming an oxide spacer by etching the deposited oxide film by means of an etching process, and then removing the mask layer pattern by means of an etching process;

implanting highly concentrated impurities into the exposed silicon substrate to form source and drain regions, and then forming a transition metal film on the exposed polysilicon pattern and the silicon substrate surface portion;

removing the oxide spacer by means of an etching process, and then forming a gate electrode by etching the exposed side of said polysilicon pattern using an etching process utilizing said transition metal film serves as a barrier to etching; and implanting low concentrated impurities into said source and drain regions, and then slantwise implanting the impurities of another type.

9. The method for manufacturing a transistor of a semiconductor device of claim 8, wherein said mask layer is formed by depositing nitride.

10. The method for manufacturing a transistor of a semiconductor device of claim 8, wherein said etching process is used in a mixed solution of HF and $HNO_3$ to form the polysilicon pattern.

11. The method for manufacturing a transistor of a semiconductor device of claim 8, wherein in the case where said mask layer is composed of nitride, $H_3PO_4$ at a temperature ranging between 160 to 180 degree Celsius is used in the etching process of said mask pattern to be the same size as said polysilicon pattern and in the etching process for removing said mask layer pattern.

12. The method for manufacturing a transistor of a semiconductor device of claim 8, wherein said oxide film is a low temperature oxide film deposited to the thickness of 2000–3000 Å by at low temperature.

13. The method for manufacturing a transistor of a semiconductor device of claim 8, wherein the etching process used for forming said oxide spacers uses RIE.

14. The method for manufacturing a transistor of a semiconductor device of claim 8, wherein the etching process is used in HF or a mixed solution of HF and $NH_4F$ to remove the oxide spacer.

15. The method for manufacturing a transistor of a semiconductor device of claim 8, wherein in case where the impurities used for forming said source and drain regions are N-type, the impurities which are slantwise implanted are high concentration P-type impurities.

* * * * *